(12) United States Patent  
Baliga

(10) Patent No.: US 10,804,393 B1  
(45) Date of Patent: Oct. 13, 2020

(54) MONOLITHICALLY-INTEGRATED AC SWITCH HAVING JBSFETS THEREIN WITH COMMONLY-CONNECTED DRAIN AND CATHODE ELECTRODES

(71) Applicant: North Carolina State University, Raleigh, NC (US)

(72) Inventor: Bantval Jayant Baliga, Raleigh, NC (US)

(73) Assignee: North Carolina State University, Raleigh, NC (US)

( * ) Notice: Subject to any disclaimer, the term of this patent is extended or adjusted under 35 U.S.C. 154(b) by 0 days.

(21) Appl. No.: 16/434,713

(22) Filed: Jun. 7, 2019

Related U.S. Application Data

(63) Continuation of application No. 15/925,826, filed on Mar. 20, 2018, now Pat. No. 10,355,132.

(60) Provisional application No. 62/624,989, filed on Feb. 1, 2018, provisional application No. 62/526,192, filed on Jun. 28, 2017, provisional application No. 62/473,761, filed on Mar. 20, 2017.

(51) Int. Cl.
| | |
|---|---|
| *H01L 29/78* | (2006.01) |
| *H01L 29/16* | (2006.01) |
| *H01L 29/423* | (2006.01) |
| *H01L 29/66* | (2006.01) |

(52) U.S. Cl.
CPC ...... *H01L 29/7836* (2013.01); *H01L 29/1608* (2013.01); *H01L 29/42376* (2013.01); *H01L 29/6656* (2013.01); *H01L 29/6659* (2013.01); *H01L 29/66666* (2013.01); *H01L 29/7827* (2013.01); *H01L 29/7811* (2013.01); *H01L 29/7823* (2013.01)

(58) Field of Classification Search
CPC ............ H01L 29/7836; H01L 29/1608; H01L 29/42376; H01L 29/6656; H01L 29/6659; H01L 29/66666; H01L 29/7827
See application file for complete search history.

(56) References Cited

U.S. PATENT DOCUMENTS

| | | | | |
|---|---|---|---|---|
| 4,994,904 A | * | 2/1991 | Nakagawa | H01L 27/0251 257/212 |
| 5,262,668 A | * | 11/1993 | Tu | H01L 29/872 257/475 |
| 5,349,212 A | * | 9/1994 | Seki | H01L 29/7393 257/132 |

(Continued)

*Primary Examiner* — Ida M Soward  
(74) *Attorney, Agent, or Firm* — Myers Bigel, P.A.

(57) ABSTRACT

A monolithically-integrated AC switch includes a semiconductor substrate having first and second insulated-gate field effect transistors therein, which contain first and second spaced-apart and independently-controllable source terminals extending adjacent a first surface of the semiconductor substrate, yet share a common drain electrode extending adjacent a second surface of the semiconductor substrate. According to some of these embodiments of the invention, the first and second insulated-gate field effect transistors include respective first and second independently-controllable gate electrodes, which extend adjacent the first surface. The first and second insulated-gate field effect transistors may be configured as first and second vertical power MOSFETs, respectively. The semiconductor substrate may also include at least one edge termination region therein, which extends between the first and second vertical power MOSFETs.

23 Claims, 10 Drawing Sheets

(56) References Cited

U.S. PATENT DOCUMENTS

| | | | | |
|---|---|---|---|---|
| 5,703,390 A * | 12/1997 | Itoh | | H01L 27/088 257/337 |
| 7,230,299 B2 * | 6/2007 | Robb | | H02H 9/004 257/337 |
| 7,235,857 B2 * | 6/2007 | Majumdar | | H01L 21/8213 257/510 |
| 7,556,994 B2 * | 7/2009 | Sankin | | H01L 27/098 438/137 |
| 7,863,685 B2 * | 1/2011 | Hshieh | | H01L 29/1095 257/368 |
| 7,919,824 B2 | 4/2011 | Ono et al. | | |
| 7,982,239 B2 * | 7/2011 | McNutt | | H01L 29/7397 257/133 |
| 8,013,360 B2 | 9/2011 | Saito et al. | | |
| 8,378,427 B2 * | 2/2013 | Chen | | H01L 27/0705 257/341 |
| 8,546,874 B2 * | 10/2013 | Hefner | | H01L 21/0465 257/328 |
| 9,281,392 B2 | 3/2016 | Weyers et al. | | |
| 9,577,046 B1 * | 2/2017 | Hori | | H01L 29/872 |
| 9,735,769 B1 * | 8/2017 | Titus | | H03K 17/162 |
| 9,947,741 B2 | 4/2018 | Schulze et al. | | |
| 10,109,725 B2 | 10/2018 | Storasta et al. | | |
| 2010/0007782 A1 | 1/2010 | Segami et al. | | |
| 2010/0244047 A1 * | 9/2010 | Hull | | H01L 29/0847 257/77 |
| 2014/0284701 A1 | 9/2014 | Korec | | |
| 2015/0069417 A1 * | 3/2015 | Ryu | | H01L 29/7811 257/77 |
| 2015/0162432 A1 | 6/2015 | Kumagai | | |
| 2015/0333177 A1 | 11/2015 | Zhang et al. | | |
| 2017/0148871 A1 * | 5/2017 | Kocon | | H01L 29/7804 |
| 2017/0194438 A1 | 7/2017 | Kumagai et al. | | |
| 2018/0019309 A1 * | 1/2018 | Radhakrishnan | | H01L 29/7811 |
| 2018/0166530 A1 * | 6/2018 | Lichtenwalner | | H01L 29/7811 |

\* cited by examiner

US 10,804,393 B1

MONOLITHICALLY-INTEGRATED AC SWITCH HAVING JBSFETS THEREIN WITH COMMONLY-CONNECTED DRAIN AND CATHODE ELECTRODES

REFERENCE TO PRIORITY APPLICATIONS

This application is a continuation of and claims priority from U.S. application Ser. No. 15/925,826, filed Mar. 20, 2018, which claims priority to U.S. Provisional Application No. 62/473,761, filed Mar. 20, 2017, U.S. Provisional Application No. 62/526,192, filed Jun. 28, 2017, and U.S. Provisional Application No. 62/624,989, filed Feb. 1, 2018, the disclosures of which are hereby incorporated herein by reference.

STATEMENT OF GOVERNMENT INTEREST

This invention was made with government support under grant number DE-EE0006521 awarded by the Department of Energy. The government has certain rights to this invention.

FIELD OF THE INVENTION

The present invention relates to semiconductor devices and methods of operating same and, more particularly, to power semiconductor devices and methods of operating same.

BACKGROUND OF THE INVENTION

A power switch that can block high voltages in first and third quadrants of operation with zero gate bias, conduct current in the first and third quadrants with insulated-gate control, and exhibit gate-controlled current saturation capability with good forward-biased safe-operating-area (FB-SOA) is advantageous for matrix converter and other power applications. Several conventional options for bi-directional four quadrant switches have been proposed for power applications, but all such options require the use of multiple integrated circuit chips.

As shown by FIG. 1A, a first option 10a utilizes two series-connected IGBTs and diodes. The emitter terminals of the two IGBTs are connected together to allow driving the gates of the IGBTs using a common emitter node. As will be understood by those skilled in the art, this first configuration may have relatively high conduction losses because the on-state voltage drop of the composite switch is equivalent to a sum of an IGBT forward voltage drop and a diode voltage drop. In addition, the switching speed of the first configuration is typically limited by the turn-off tail of the IGBTs. As shown by FIG. 1B, a second option 10b utilizes two symmetric reverse-blocking IGBTs (RB-IGBTs) connected in anti-parallel. This second option has lower on-state voltage drop relative to the first option, but relatively poor switching speed due to the large amount of charge stored in the blocking IGBT structure. Referring now to FIG. 1C, a third option 10c uses two 4H-SiC Power MOSFETs connected in series (with diodes). This third option has relatively fast switching speed and good FBSOA resulting from the I-V characteristics of the 4H-SiC power MOSFETs. However, the conduction power losses of this third option are typically high because the on-state voltage drop of the composite switch is a sum of a 4H-SiC power MOSFET voltage drop and a diode voltage drop. Next, as shown by FIG. 1D, a fourth option 10d utilizes two 4H-SiC power MOSFETs connected in anti-parallel (with series diodes) to provide reverse blocking capability. This fourth option has relatively fast switching speed and good FBSOA resulting from the I-V characteristics of the 4H-SiC power MOSFETs. However, the conduction power losses are relatively high because the on-state voltage drop of the composite switch is a sum of a 4H-SiC power MOSFET voltage drop and a diode voltage drop. In addition, level-shifting the gate bias is required for one of the 4H-SiC power MOSFETs.

In order to assemble the bidirectional switches of FIGS. 1C and 1D, the SiC power MOSFETs must be individually packaged to maintain separate drain terminals. For example, as shown by FIG. 2, a semiconductor substrate 20 (e.g., wafer), which may contain an array of power MOSFETs therein (with top side gate (G) and source (S) terminals and bottom side drain (D) terminals (not shown)), can be diced along scribe lines into discrete chips having equivalent length and width dimensions (A). Accordingly, conventional bidirectional switches using SiC power MOSFETs typically require multiple discrete devices: four (4) devices in the case of the third option of FIG. 1C and six (6) devices in the case of the fourth option of FIG. 1D. This requirement increases packaging costs and typically introduces inductance between the devices, which can degrade circuit performance.

SUMMARY OF THE INVENTION

A monolithically-integrated AC switch according to embodiments of the invention includes a semiconductor substrate having first and second insulated-gate field effect transistors therein, which contain first and second spaced-apart and independently-controllable source terminals extending adjacent a first surface of the semiconductor substrate, yet share a common drain electrode extending adjacent a second surface of the semiconductor substrate. According to some of these embodiments of the invention, the first and second insulated-gate field effect transistors include respective first and second independently-controllable gate electrodes, which extend adjacent the first surface. The first and second insulated-gate field effect transistors may be configured as first and second vertical power MOSFETs, respectively. The semiconductor substrate may also include at least one edge termination region therein, which extends between the first and second vertical power MOSFETs.

According to still further embodiments of the invention, first and second gate terminals are provided, which are electrically connected to the first and second gate electrodes, respectively. Furthermore, the first and second source terminals may be patterned as generally rectangular metal terminals, which are disposed side-by-side on the first surface of the semiconductor substrate, with the first and second gate terminals being disposed on opposite sides of the first surface of the semiconductor substrate. An integrated circuit package may also be provided, which encloses the semiconductor substrate. This integrated circuit package may have a first plurality of electrically conductive leads extending therethrough, which are electrically connected to respective ones of the first and second source terminals. This integrated circuit package may also be devoid of any electrically conductive lead connected to the common drain electrode.

According to still further embodiments of the invention, the semiconductor substrate may include first and second Schottky barrier rectifiers, with the first MOSFET extending between the edge termination region and the first Schottky barrier rectifier and the second MOSFET extending between the edge termination region and the second Schottky barrier rectifier. The common drain electrode may also operate as a common cathode electrode of the first and second Schottky barrier rectifiers.

According to additional embodiments of the invention, a packaged integrated circuit device may be provided, which contains a semiconductor substrate having first and second JBSFETs, which share a common drain electrode, integrated at side-by-side locations therein. These first and second JBSFETs can share a common cathode electrode, which may be coextensive with the common drain electrode. The integrated circuit device may also include an integrated circuit package, which encloses the semiconductor substrate and has a pair of source terminal leads and a pair of gate terminal leads extending therethrough. This integrated circuit package may be devoid of any drain or cathode leads. For example, in some embodiments of the invention, the integrated circuit package may include only four leads therein, which are connected to corresponding source and gate terminals of the first and second JBSFETs.

DETAILED DESCRIPTION OF EMBODIMENTS

Figure 1A:
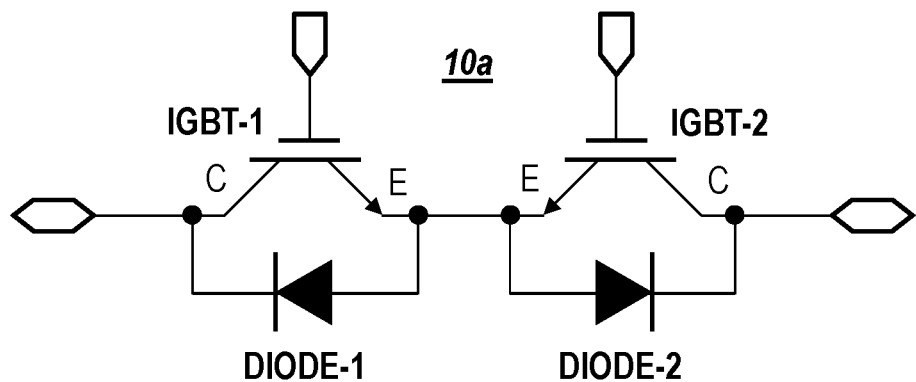
FIG. 1A is an electrical schematic of an AC switch containing IGBTs and diodes, according to the prior art.
Figure 1B:
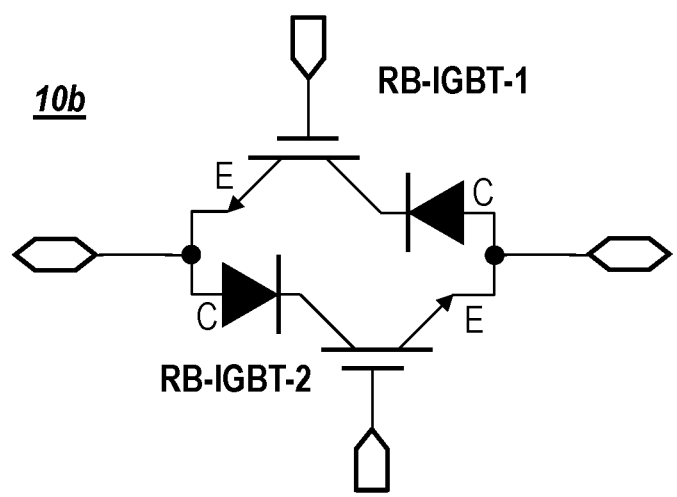
FIG. 1B is an electrical schematic of an AC switch containing reverse-blocking IGBTs, according to the prior art.
Figure 1C:
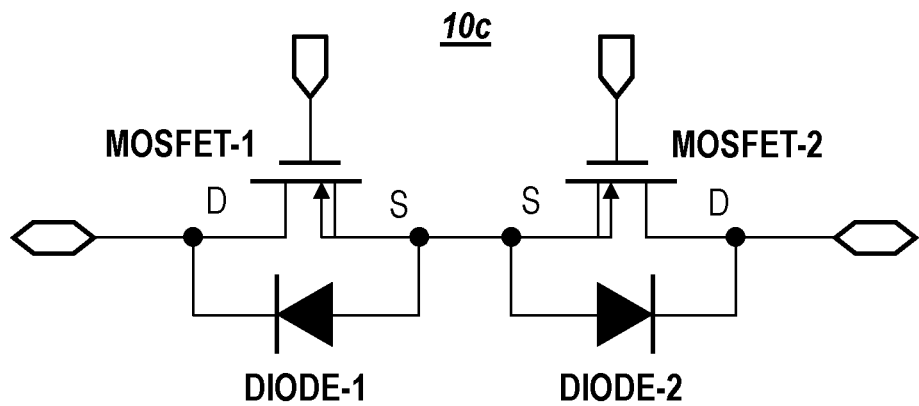
FIG. 1C is an electrical schematic of an AC switch containing power MOSFETs and diodes, according to the prior art.
Figure 1D:
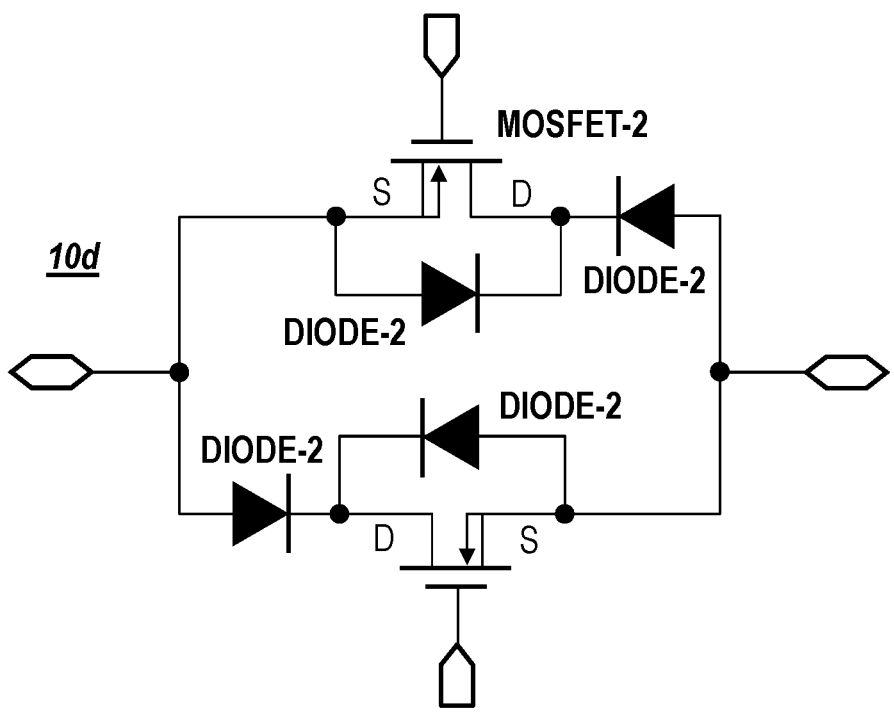
FIG. 1D is an electrical schematic of an AC switch containing power MOSFETs and diodes, according to the prior art.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3A:
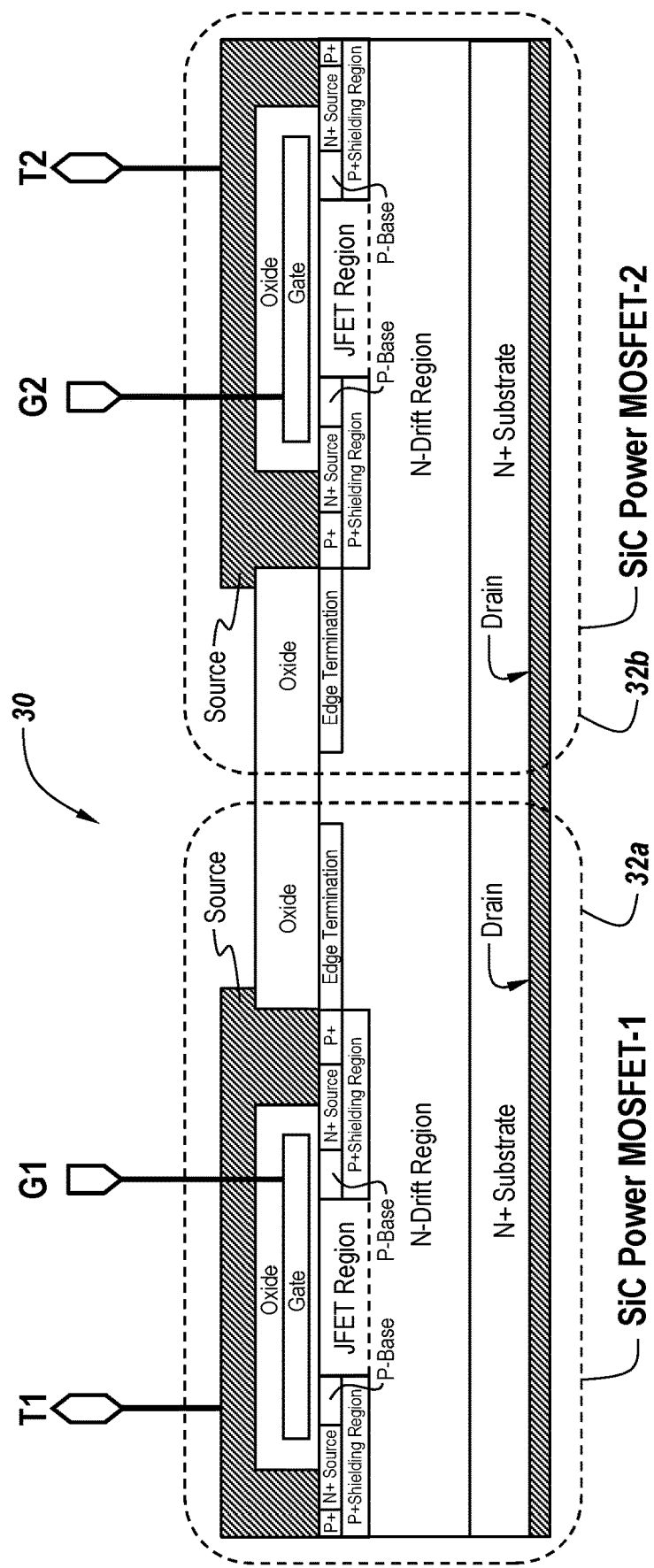
FIG. 3A is a cross-sectional view of a SiC AC switch according to an embodiment of the present invention.
Figure 3B:
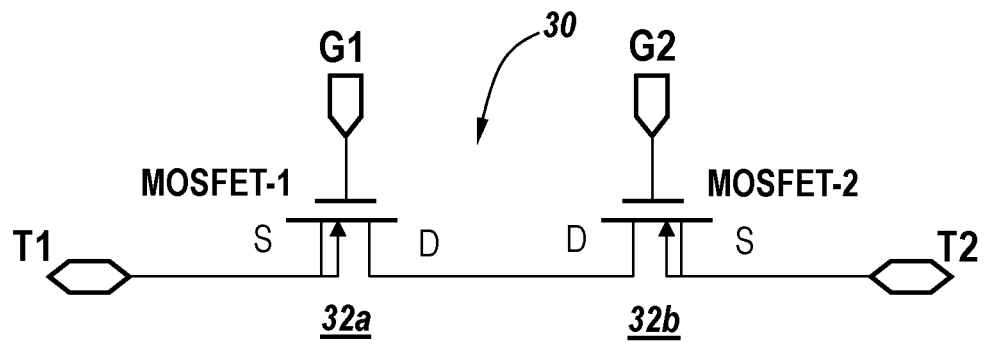
FIG. 3B is an electrical schematic of the AC switch of FIG. 3A.
Figure 3C:
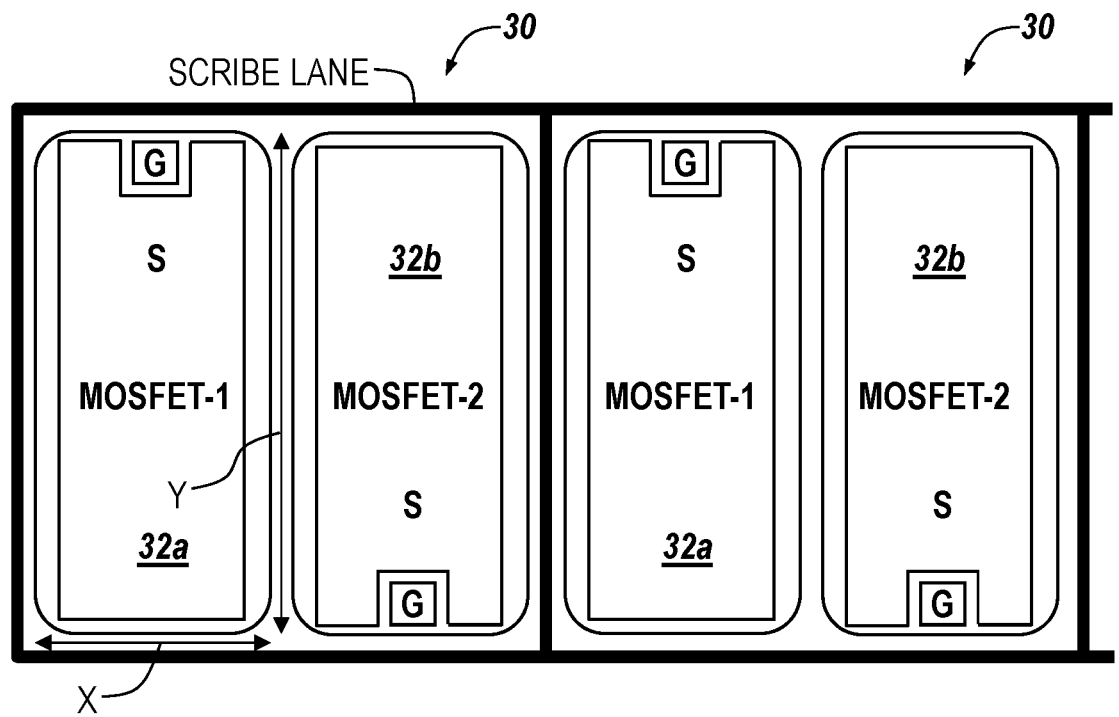
FIG. 3C is a plan layout view of a semiconductor substrate containing an array of AC switches therein, according to an embodiment of the present invention.

Referring now to FIGS. 3A-3C, a bidirectional AC switch 30 according to an embodiment of the invention is illustrated as including first and second insulated-gate field effect transistors (IGFETs), which are monolithically-integrated at side-by-side locations within a single integrated circuit substrate (e.g., single-crystal semiconductor chip). The first IGFET is shown as a first silicon carbide (SiC) MOSFET 32a and the second IGFET is shown as a second SiC MOSFET 32b. These MOSFETs 32a, 32b share a common current-carrying drain electrode (DRAIN), which is disposed as a metal layer on a second/bottom surface of the semiconductor substrate, yet have distinct gate terminals (G1, G2) and distinct (and bidirectional) current-carrying source terminals T1, T2, which are disposed on a first/top surface of the semiconductor substrate. The MOSFETs 32a, 32b are also shown as being separated from each other by a pair of edge termination regions, which may be of conventional design.

As will be understood by those skilled in the art, the first SiC MOSFET 32a can be turned on by applying a sufficiently positive gate bias to the first gate terminal G1 (and corresponding polysilicon gate) relative to terminal T1, to thereby establish a highly conductive inversion layer channel within an underlying P-base region (P-Base). This highly conductive inversion layer channel supports bidirectional and predominantly vertical current flow by electrically connecting an N+ semiconductor source region to a central JFET "neck" region, N-Drift region and N+ Substrate region on the left side of the AC switch 30. Likewise, the second SiC MOSFET 32b can be turned on by applying a sufficiently positive gate bias to the second gate terminal G2 (and corresponding polysilicon gate) relative to terminal T2, to thereby establish a highly conductive inversion layer channel within an underlying P-base region (P-Base). This highly conductive inversion layer channel supports bidirectional and predominantly vertical current flow by electrically connecting an N+ semiconductor source region to a central JFET "neck" region, N-Drift region and N+ Substrate region on the right side of the AC switch 30. Advantageously, the concurrent activation of the first and second SiC MOSFETs 32a, 32b enables bidirectional (and high) current transfer between the source terminals T1 and T2 with relatively low voltage drop, to thereby operate as a high power AC switch.

Alternatively, in the event the first SiC MOSFET 32a is turned off and the second SiC MOSFET 32b is turned on, unidirectional current may nonetheless be provided from source terminal T1 to source terminal T2 once the built-in turn-on voltage of a first P-N junction diode (defined by the P+ Shielding Region/N-Drift region on the left side of the AC switch 30) is exceeded. Similarly, if the second SiC MOSFET 32b is turned off and the first SiC MOSFET 32a is turned on, unidirectional current may be provided from source terminal T2 to source terminal T1 once the built-in turn-on voltage of a second P-N junction diode (defined by the P+ Shielding Region/N-Drift region on the right side of the AC switch 30) is exceeded. As shown by FIG. 3B, these bidirectional and unidirectional modes of operation are highlighted by the equivalent circuit of the AC switch 30.

As will be understood by those skilled in the art, the source terminal T1 of the AC switch 30 can be treated as a reference terminal, with relatively high voltages applied to source terminal T2 during operation. The AC switch 30 provides bidirectional blocking voltage capability with both gate terminals G1 and G2 held at zero volts relative to their corresponding source terminals T1 and T2. In this manner, a blocking voltage can be supported across the first MOSFET 32a when source terminal T2 has a positive voltage and a blocking voltage can be supported across the second MOSFET 32b when source terminal T2 has a negative voltage.

In particular, when the source terminal T2 voltage is positive, current flow can occur in the "first quadrant" by application of a positive bias to the first gate terminal G1 (relative to terminal T1) to thereby turn-on the first MOSFET 32a. This "first quadrant" current flows via the right side "body" diode of the second MOSFET 32b if the second gate terminal G2 is biased at zero volts relative to the source terminal T2 of the second MOSFET 32b. This body diode, which is defined by the P+ ohmic contact region (adjacent the N+ Source), P+ shielding region, N-Drift region and N+ Substrate, adds a SiC diode voltage drop of about 3.5 volts to the AC switch 30. Alternately, if a sufficiently positive gate bias is applied to the second gate terminal G2 (relative to terminal T2), then current will flow through the inversion layer channels of both MOSFETs 32a, 32b with only a relatively small on-state voltage drop (as determined by the on-resistance of the MOSFETs 32a, 32b).

In contrast, if the source terminal T2 voltage is negative (relative to source terminal T1), current flow can occur in the "third quadrant" by the application of a positive bias to the second gate terminal G2 (relative to terminal T2) to thereby turn-on the second MOSFET 32b. This "third quadrant" current flows via the left side "body" diode of the first MOSFET 32a (if the first gate terminal G1 is biased at zero volts relative to the source terminal T1 of the first MOSFET 32a). This adds a SiC diode voltage drop of about 3.5 volts to the AC switch 30. Alternately, if a sufficiently positive gate bias is applied to the first gate terminal G1 (relative to terminal T1), then current will flow through the inversion layer channels of both MOSFETs 32a, 32b with only a relatively small on-state voltage drop (as determined by the on-resistance of the MOSFETs 32a, 32b).

Accordingly, the AC switch 30 of FIG. 3A can provide gate-controlled current saturation in both the first and third quadrants with the excellent FBSOA of the two SiC power MOSFETs 32a, 32b. The AC switch 30 of FIG. 3A can also have fast switching performance as a result of the unipolar current transport within the serially-connected MOSFETs.

In addition, as shown by FIG. 3C, an array of AC switches 30 may be defined on an integrated circuit substrate (e.g., wafer) as an array of pairs of side-by-side "rectangular" MOSFETs 32a, 32b, which may be diced into respective chips along scribe lanes. As shown, the gate electrodes for the two MOSFETs 32a, 32b are located on opposite sides of each resulting chip, which makes it convenient to package the AC switch 30 with side-by-side source terminals S and gate terminals G located on opposite sides of an integrated circuit package enclosing the chip.

Figure 2:
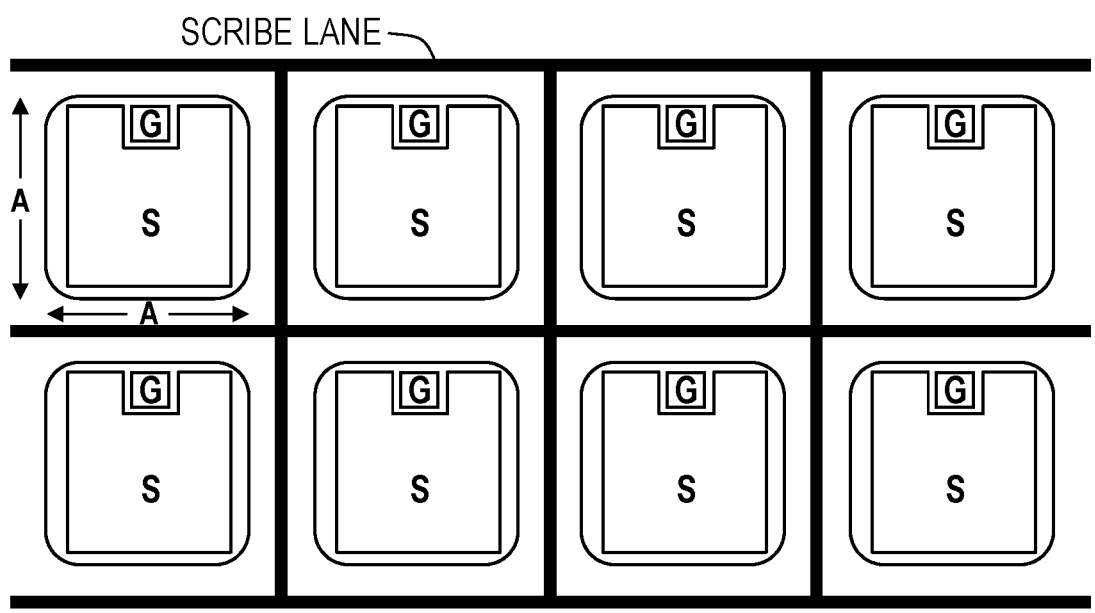
FIG. 2 is a plan layout view of a semiconductor substrate containing an array of power MOSFETs therein, which can be diced along scribe lines into discrete chips, according to the prior art.

As will be understood by those skilled in the art, the active area for the square MOSFETs of FIG. 2 and rectangular MOSFETs of FIG. 3C must be the same to obtain the same on-state resistance. Thus, the area $A^2$ (in FIG. 2) should equal X*Y (in FIG. 3C), which means X can equal $a/(2^{1/2})$ and Y can equal $A*2^{1/2}$.

Figure 4A:
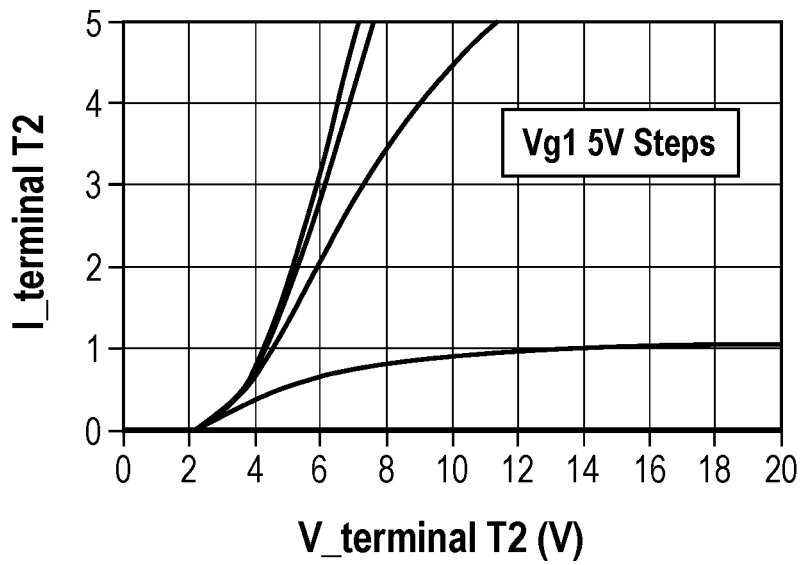
FIG. 4A is a graph of source terminal current (I_terminal T2 (A)) versus source terminal voltage (V_terminal T2) for the AC switch of FIG. 3A, for the case where VG2=0V.
Figure 4B:
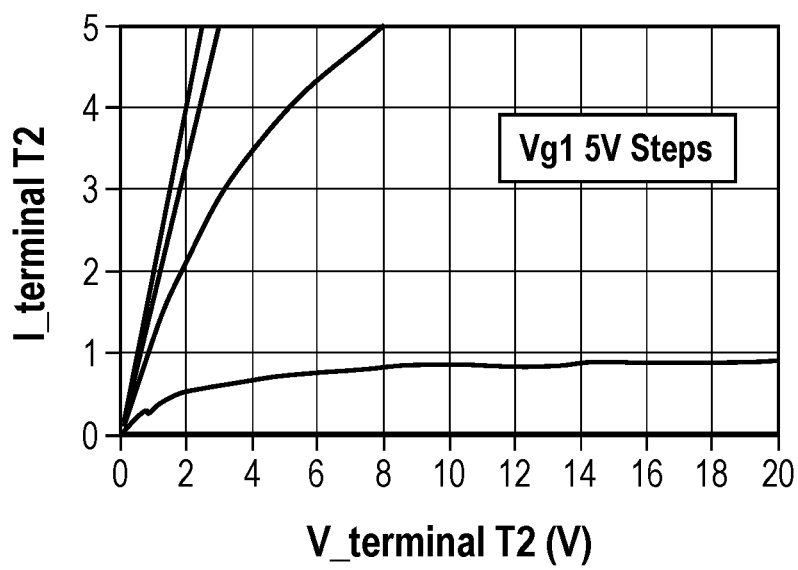
FIG. 4B is a graph of source terminal current (I_terminal T2 (A)) versus source terminal voltage (V_terminal T2) for the AC switch of FIG. 3A, for the case where VG2=25V.

Referring now to FIGS. 4A-4B, a proposed AC switch 30 was experimentally validated by testing two adjacent 1.2 kV, 5 Amp SiC power MOSFETs 32a, 32b on an integrated circuit chip. The characteristics obtained with VG2=0V (i.e., MOSFET 32b turned off) are shown by FIG. 4A, where a "knee" of about 3V is observed (before current conduction) because the current flows via the P-N junction body diode of MOSFET 32b. This current flow via a body diode increases the on-state voltage drop and power dissipation in the AC switch 30.

As shown by FIG. 4B, the knee of FIG. 4A can be eliminated by applying a bias of 25V to the gate terminal G2 (relative to T2, the source of MOSFET 32b), to thereby significantly reduce the forward on-state voltage drop across the SiC AC switch 30.

Figure 5A:
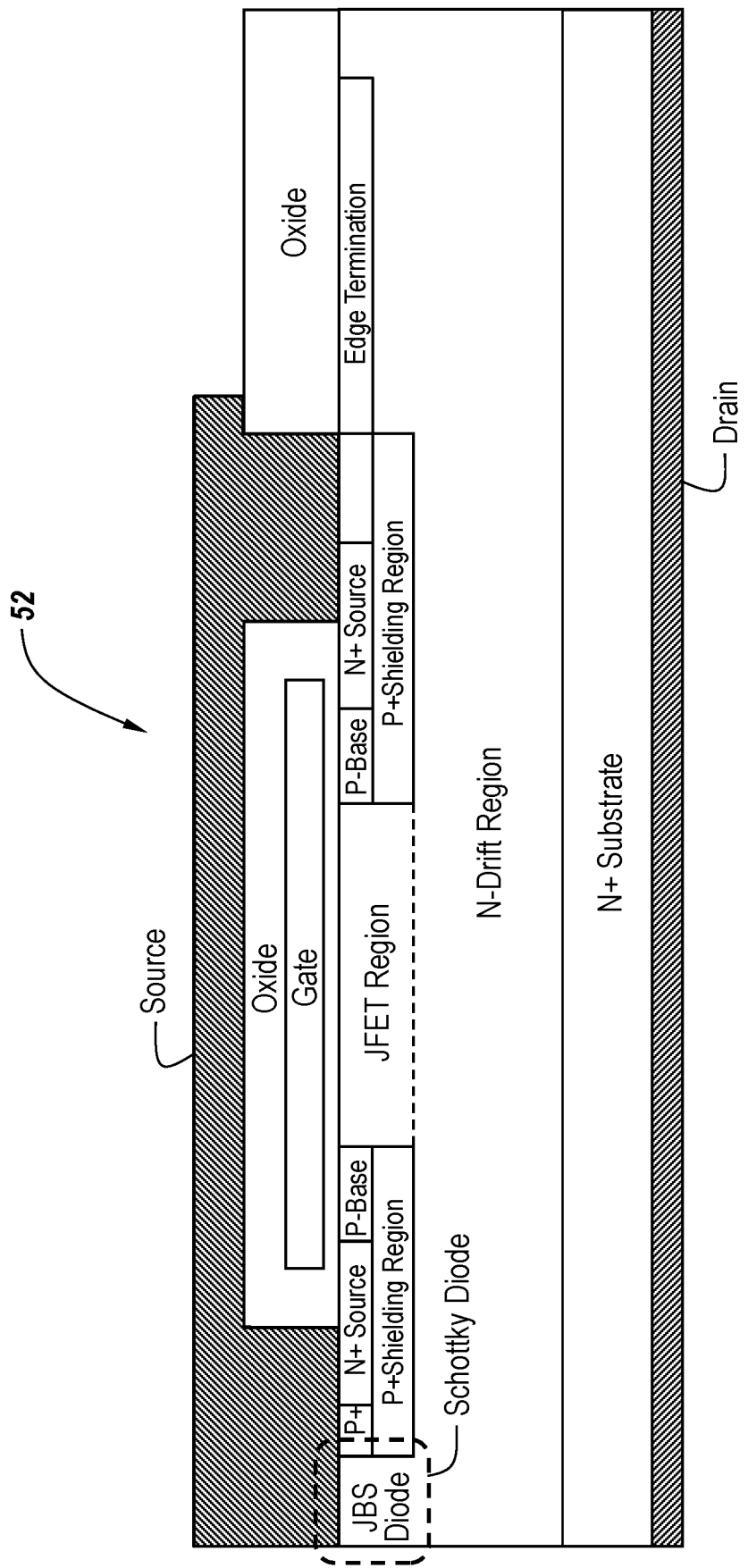
FIG. 5A is a cross-sectional view of a SiC JBSFET according to an embodiment of the present invention.

However, as will be understood by those skilled in the art, during certain operating modes, it may not be possible to ensure that the bias to gate terminal G2 is applied when forward current is expected to flow through the SiC AC switch 30. This constraint may induce degradation in the characteristics of the SiC power MOSFET 32b caused by bipolar current transport in the body diode. Nonetheless, this problem can be circumvented by replacing each of the pair of SiC MOSFETs 32a, 32b with a SiC power JBSFET (i.e., junction barrier Schottky FET). A cross-sectional view of a SiC power JBSFET 52 is illustrated by FIG. 5A. As shown, this JBSFET 52 includes a JBS diode (Schottky diode), which is disposed adjacent (and in parallel with) the built-in P-N junction body diode.

Figure 5B:
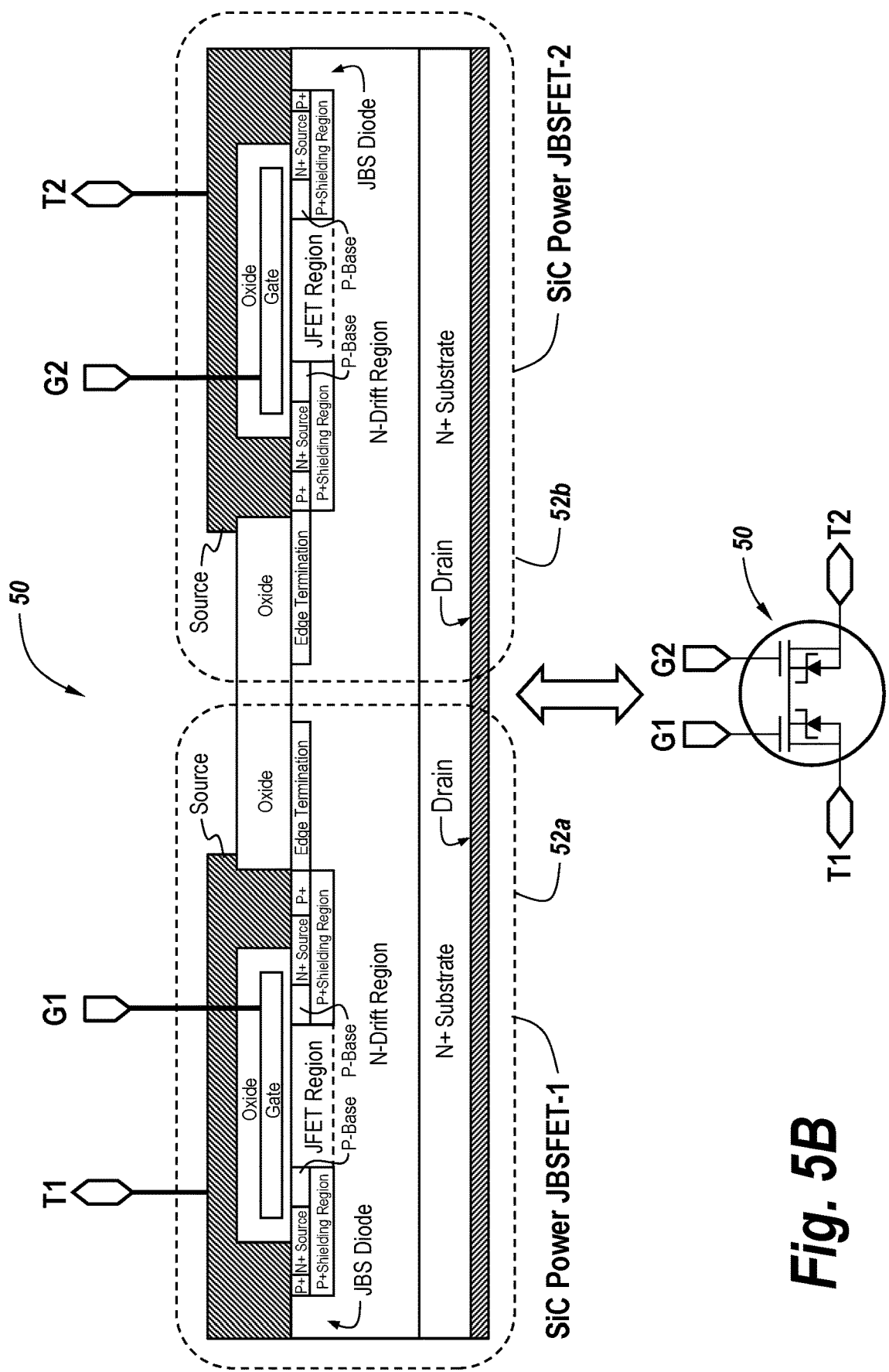
FIG. 5B is a cross-sectional view and symbol schematic of a SiC AC switch containing the JBSFETs of FIG. 5A therein, according to an embodiment of the present invention.
Figure 7:
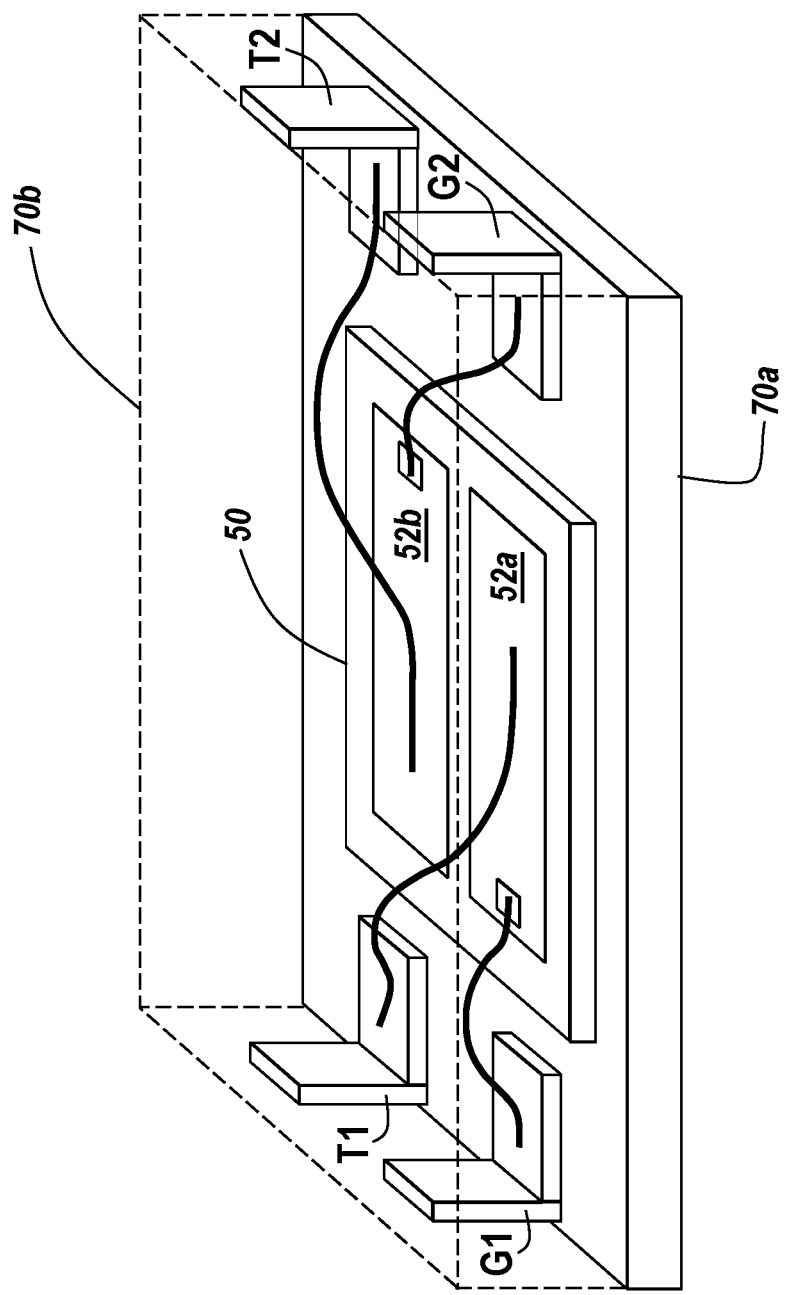
FIG. 7 is a perspective view of a packaged SiC AC switch of FIG. 5B. according to an embodiment of the present invention.

As shown by FIG. 5B, this configuration of the JBSFET 52 of FIG. 5A allows for the monolithic integration of an AC switch 50 as illustrated by FIG. 5B. This AC switch 50 includes a first JBSFET 52*a* and a second JBSFET 52*b*, which can be fabricated adjacent to each other and diced as a pair into a single chip and packaged with just four terminals: T1, G1, T2 and G2, with the common drain soldered to a metal pad within the package to thereby enable current flow between JBSFET 52*a* and JBSFET 52*b*. Thus, as illustrated by FIG. 7, a two-piece integrated circuit package (70*a*, 70*b*) may be utilized to enclose the AC switch 50 with only four electrically conductive leads extending therethrough, which operate as terminals T1, G1, T2 and G2.

Figure 6A:
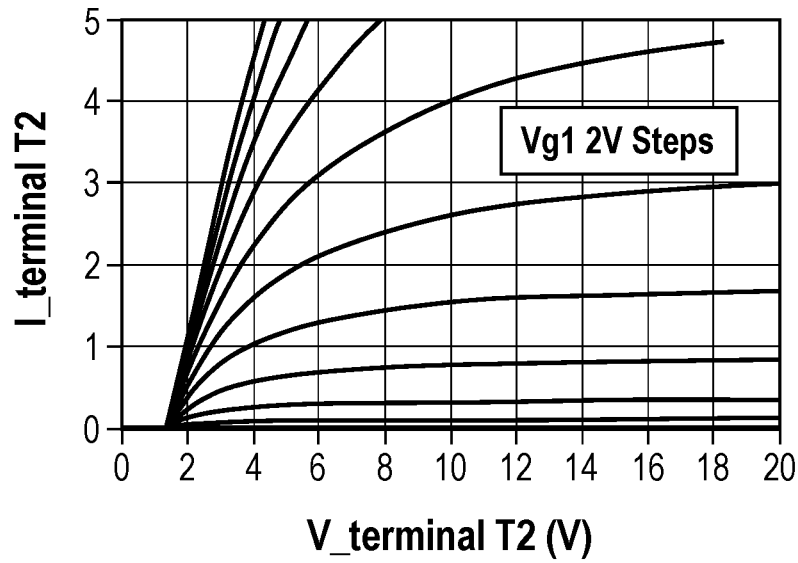
FIG. 6A is a graph of source terminal current (I_terminal T2 (A)) versus source terminal voltage (V_terminal T2) for the AC switch of FIG. 5B, for the case where VG2=0V.
Figure 6B:
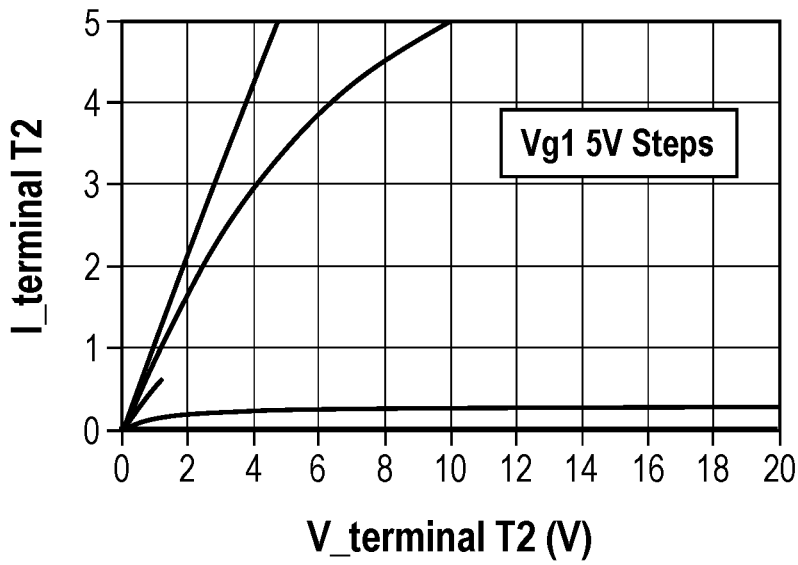
FIG. 6B is a graph of source terminal current (I_terminal T2 (A)) versus source terminal voltage (V_terminal T2) for the AC switch of FIG. 5B, for the case where VG2=25V.

Referring now to the graphs of FIGS. 6A-6B, the bidirectional AC switch 50 of FIG. 5B was experimentally validated by testing two adjacent 1.2 kV, 5 A SiC power JBSFETs on a common SiC substrate (e.g., wafer). The I-V characteristics obtained with VG2=0V are shown in FIG. 6A, where a "knee" of about 1V is observed before current conduction. This knee, which is caused by the current conduction across the forward-biased JBS diode of the second JBSFET 52*b*, increases the on-state voltage drop and power dissipation of the AC switch 50. As illustrated by FIG. 6B, this knee can be eliminated by the application of a positive bias to the second gate terminal G2 (i.e., VG2=25V, relative to T2), which significantly reduces the on-state voltage drop by bypassing the JBS diode. Nonetheless, because it may not always be possible to ensure that a sufficient bias is applied to gate terminal G2 whenever current must flow through the AC switch 50, the presence of the JBS diode in each JBSFET 52*a*, 52*b* advantageously yields a significantly lower on-state voltage drop without any degradation in other performance characteristics. This lower on-state voltage drop is a consequence of the lower built-in potential of the JBS diode relative to the corresponding P-N junction body diode of FIG. 3A.

Accordingly, the use of a SiC-based AC switch 50 can be expected to significantly improve the efficiency and the power density of power converters. Conventional approaches of ac-dc conversion (ac source feeding the dc load), ac-ac conversion (motor drives), and dc-ac conversion (renewable energy integration) involve multiple power stages. These multiple stages are often decoupled from each other using intermediate passive elements, which can occupy significant volume and compromise the power density and reliability. For example, a DC-link capacitor can be used to decouple the dynamics of an ac-dc rectifier stage and a dc-ac inverter stage, which reduces reliability and power density. A high frequency link inverter to realize the same functionality can be achieved using a cyclo-converter on the secondary side of a medium frequency transformer, which combines the functionality of rectifier and inverter stages. In addition to the cyclo-converter based high frequency link inverter, a bi-directional AC switch also finds applications in matrix converters. The direct matrix converter with three-phase input and three-phase output consists of bidirectional switches to directly connect the input side with the output side, without any intermediate dc-link storage element. This greatly enhances the reliability of the power conversion stage, as capacitors are the weak link and often responsible for power converter failure. The bi-directional AC switch described and illustrated herein can be also used as a basic building block in isolated AC-AC conversion for solid-state transformer applications.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A monolithically-integrated and bidirectional AC switch, comprising:
   a semiconductor substrate having first and second junction barrier Schottky insulated-gate field effect transistors (JBSFETs) therein, which contain first and second spaced-apart and independently-controllable source terminals extending adjacent a first surface of said semiconductor substrate, yet share a common drain electrode extending adjacent a second surface of said semiconductor substrate.

2. The AC switch of claim 1, wherein the first and second JBSFETs comprise respective first and second independently-controllable gate electrodes, which extend adjacent the first surface.

3. The AC switch of claim 2, wherein the first and second source terminals are patterned as generally rectangular first and second metal source terminals disposed side-by-side on the first surface of said semiconductor substrate, which has a rectangular shape; wherein first and second gate terminals, which are electrically connected to the first and second gate electrodes, respectively, are disposed on opposite sides of the first surface of said semiconductor substrate; wherein said semiconductor substrate has first and second opposing sides and third and fourth opposing sides, which terminate at the first and second opposing sides; wherein the first gate terminal extends closer to the first side relative to the second gate terminal; and wherein the second gate terminal extends closer to the second side relative to the first gate terminal.

4. The AC switch of claim 3, further comprising an integrated circuit package enclosing said semiconductor substrate, said integrated circuit package having a first plurality of electrically conductive leads extending therethrough, which are electrically connected to respective ones of the first and second source terminals.

5. The AC switch of claim 3, wherein said semiconductor substrate is a semiconductor chip having length and width dimensions that are about equivalent.

6. The AC switch of claim 2, further comprising an integrated circuit package enclosing said semiconductor substrate, said integrated circuit package having a first plurality of electrically conductive leads extending therethrough, which are electrically connected to respective ones of the first and second source terminals.

7. The AC switch of claim 2, wherein the first JBSFET comprises a first source/anode terminal and the second JBSFET comprises a second source/anode terminal, which is independently controllable relative to the first source/anode terminal.

8. The AC switch of claim 2, wherein the first JBSFET comprises a first insulated-gate field effect transistor and a first Schottky-barrier diode and the second JBSFET comprises a second insulated-gate field effect transistor and a second Schottky-barrier diode; wherein a source terminal of the first insulated-gate field effect transistor also operates as an anode terminal of the first Schottky-barrier diode; and wherein a source terminal of the second insulated-gate field effect transistor also operates as an anode terminal of the second Schottky-barrier diode.

9. The AC switch of claim 8, wherein said semiconductor substrate comprises at least one edge termination region therein, which extends between the first and second JBSFETs.

10. The AC switch of claim 1, wherein said semiconductor substrate comprises an N-type drift region therein; wherein the first source terminal forms a first Schottky-rectifying junction with a first portion of the N-type drift region and the second source terminal forms a second Schottky-rectifying junction with a second portion of the N-type drift region.

11. A monolithically-integrated AC switch, comprising:
a semiconductor substrate having first and second vertical power MOSFETs therein, which contain: (i) first and second independently-controllable source terminals, and (ii) first and second independently-controllable gate electrodes at spaced-apart locations on a first surface of said semiconductor substrate, yet share a common drain electrode extending adjacent a second surface of said semiconductor substrate;
wherein said semiconductor substrate comprises at least one edge termination region therein;
wherein said semiconductor substrate comprises first and second Schottky barrier rectifiers;
wherein the first MOSFET extends between a portion of the at least one edge termination region and the first Schottky barrier rectifier; and
wherein the second MOSFET extends between a portion of the at least one edge termination region and the second Schottky barrier rectifier.

12. The AC switch of claim 11, wherein the common drain electrode also operates as a common cathode electrode of the first and second Schottky barrier rectifiers.

13. The AC switch of claim 11, wherein the at least one edge termination region comprises a first edge termination region, which surrounds the first vertical power MOSFET and the first Schottky barrier rectifier, and a second edge termination region, which surrounds the second vertical power MOSFET and the second Schottky barrier rectifier.

14. The AC switch of claim 11, wherein the source terminal of the first insulated-gate field effect transistor operates as an anode terminal of the first Schottky barrier rectifier; wherein the source terminal of the second insulated-gate field effect transistor operates as an anode terminal of the second Schottky barrier rectifier; and wherein the common drain electrode operates as a common cathode terminal of the first and second Schottky barrier rectifiers.

15. A packaged integrated circuit device, comprising:
a semiconductor substrate having first and second JBSFETs, which share a common drain electrode, integrated at side-by-side locations therein.

16. The device of claim 15, wherein the first and second JBSFETs share a common cathode electrode; wherein a source terminal of a first FET within the first JBSFET operates as an anode terminal of a first Schottkly rectifier within the first JBSFET; wherein a source terminal of a second FET within the second JBSFET operates as an anode terminal of a second Schottkly rectifier within the second JBSFET; and wherein the first and second JBSFETs support a bidirectional current mode of operation within the device.

17. The device of claim 16, wherein the common drain electrode and the common cathode electrode are coextensive.

18. The device of claim 17, further comprising an integrated circuit package enclosing said semiconductor substrate, said integrated circuit package comprising a pair of source terminal leads and a pair of gate terminal leads extending therethrough.

19. The device of claim 18, wherein the integrated circuit package is devoid of any drain terminal or cathode terminal leads.

20. The device of claim 19, wherein the integrated circuit package includes only four leads therein, which are connected to corresponding source and gate terminals of the first and second JBSFETs.

21. A monolithically-integrated AC switch that supports unidirectional and bidirectional current modes of operation, comprising:
a semiconductor substrate having first and second vertical JBSFETs therein that share a common drain terminal, said first JBSFET comprising a first Schottky diode and a first vertical MOSFET having commonly-connected anode and source terminals, and said second JBSFET comprising a second Schottky diode and a second vertical MOSFET having commonly-connected anode and source terminals.

22. The AC switch of claim 21, wherein the anode and source terminals of the first and second vertical JBSFETs extends adjacent a first surface of said semiconductor substrate; wherein the common drain terminal extends adjacent a second surface of said semiconductor substrate.

23. The AC switch of claim 22, further comprising first and second edge termination regions, which extend adjacent the first surface of said semiconductor substrate and between the first and second vertical JBSFETs.

* * * * *